United States Patent
Seol et al.

(10) Patent No.: US 9,460,782 B2
(45) Date of Patent: Oct. 4, 2016

(54) METHOD OF OPERATING MEMORY CONTROLLER AND DEVICES INCLUDING MEMORY CONTROLLER

(71) Applicant: SAMSUNG ELECTRONICS CO., LTD., Suwon-si, Gyeonggi-do (KR)

(72) Inventors: Chang Kyu Seol, Osan-si (KR); Jun Jin Kong, Yongin-si (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 274 days.

(21) Appl. No.: 14/205,496

(22) Filed: Mar. 12, 2014

(65) Prior Publication Data

US 2014/0281293 A1    Sep. 18, 2014

(30) Foreign Application Priority Data

Mar. 15, 2013 (KR) .................. 10-2013-0028021

(51) Int. Cl.
| | |
|---|---|
| G06F 12/02 | (2006.01) |
| G11C 11/56 | (2006.01) |
| G11C 7/10 | (2006.01) |
| G11C 16/34 | (2006.01) |

(52) U.S. Cl.
CPC ......... *G11C 11/5642* (2013.01); *G11C 7/1006* (2013.01); *G11C 11/5628* (2013.01); *G11C 16/3418* (2013.01); *G11C 2211/5632* (2013.01)

(58) Field of Classification Search
None
See application file for complete search history.

(56) References Cited

U.S. PATENT DOCUMENTS

| | | |
|---|---|---|
| 8,050,086 B2 | 11/2011 | Shalvi et al. |
| 8,085,605 B2 | 12/2011 | Yang et al. |
| 2005/0089121 A1* | 4/2005 | Tsai ............... H03M 13/41 375/341 |
| 2011/0145487 A1 | 6/2011 | Haratsch et al. |
| 2011/0289376 A1 | 11/2011 | Maccarrone et al. |
| 2012/0005409 A1 | 1/2012 | Yang |
| 2012/0066436 A1 | 3/2012 | Yang |

FOREIGN PATENT DOCUMENTS

| | | |
|---|---|---|
| JP | 2011504276 A | 2/2011 |
| KR | 20110128852 A | 11/2011 |
| KR | 20120061214 A | 6/2012 |

* cited by examiner

*Primary Examiner* — Idriss N Alrobaye
*Assistant Examiner* — Dayton Lewis-Taylor
(74) *Attorney, Agent, or Firm* — Volentine & Whitt, PLLC

(57) ABSTRACT

A method of operating a memory controller includes receiving a first data sequence and generating a coset representative sequence that can be divided into m-bit strings, where "m" is a natural number of at least 2; performing a first XOR operation on each of the m-bit strings in the coset representative sequence and binary bits; calculating all possible branch metrics according to a result of the first XOR operation; determining a survivor path sequence based on the all possible branch metrics; and performing a second XOR operation on the coset representative sequence and the survivor path sequence and generating an output sequence.

12 Claims, 19 Drawing Sheets

METHOD OF OPERATING MEMORY CONTROLLER AND DEVICES INCLUDING MEMORY CONTROLLER

CROSS-REFERENCE TO RELATED APPLICATIONS

This application claims priority under 35 U.S.C. §119(a) from Korean Patent Application No. 10-2013-0028021 filed on Mar. 15, 2013, the subject matter of which is hereby incorporated by reference.

BACKGROUND

Embodiments of the inventive concept relate to memory systems and memory controllers. Embodiments of the inventive concept relate to methods of operating a memory controller that control the definition or shaping of a data pattern.

A non-volatile memory device, such as a NAND flash memory device, includes a great number of memory cells. With increased integration density made possible by emerging fabrication technologies, the separation distance between adjacent (and nearby) memory cells has decreased markedly. The increasingly close proximity of individual memory cells, together with other systemic and functional considerations, cause certain problems related to the reliability of stored data.

One important functional consideration related to data reliability in emerging non-volatile memory devices is the pattern with which data is stored across an array of proximate memory cells. Poorly defined (or undesirable) data programming patterns can lead to data degradation, whereas more appropriately defined data programming patterns result in better data reliability. For instance, during programming of a "target memory cell" selected during a programming operation, data previously stored in adjacent or proximate memory cells may be unintentionally disturbed (i.e., erroneously changed) due to certain coupling effects (e.g., electric field coupling or F-poly coupling). That is, coupling effects may change (e.g., widened) the threshold voltage distribution of proximate memory cells and adversely affect the reliability of the non-volatile memory device. Therefore, methods of enhancing the reliability of the non-volatile memory device are desired.

SUMMARY

According to some embodiments of the inventive concept, there is provided a method of operating a memory controller. The method includes receiving a first data sequence and generating a coset representative sequence that can be divided into m-bit strings, where "m" is a natural number of at least 2; performing a first XOR operation on each of the m-bit strings in the coset representative sequence and binary bits; calculating all possible branch metrics according to a result of the first XOR operation; determining a survivor path sequence based on the all possible branch metrics; and performing a second XOR operation on the coset representative sequence and the survivor path sequence and generating an output sequence.

The method may further include mapping a second data sequence to be stored in a first word line together with the output sequence and the output sequence to programmed states and controlling a non-volatile memory device to perform a program operation according to the mapped programmed states.

The all possible branch metrics may be each calculated as the sum of parameters. The parameters may be defined according to a selection bit.

When the selection bit is "1" and the result of the first XOR operation is bit "0", one of the parameters corresponding to the bit "0" may be "0". When the selection bit is "1" and the result of the first XOR operation is bit "1", one of the parameters corresponding to the bit "1" may be "1".

The calculating the all possible branch metrics may include calculating the all possible branch metrics using a first programmed state sequence, which is determined based on the result of the first XOR operation and a second data sequence to be stored in a first word line together with the output sequence, and a second programmed state sequence determined based on page data bits that have been stored in a second word line.

When a programmed state corresponding to a k-th bit line in the first programmed state sequence is an erased state and a programmed state corresponding to the k-th bit line in the second programmed state sequence is a highest programmed state, a parameter corresponding to the k-th bit line among the parameters may be "1" and the other parameters may be "0". The parameters may have different values according to the first programmed state sequence and the second programmed state sequence.

Alternatively, the calculating the all possible branch metrics may include calculating the all possible branch metrics using programmed states determined based on the result of the first XOR operation and a second data sequence to be stored in a first word line together with the output sequence.

At this time, a value of a parameter corresponding to a k-th bit line among the parameters may be determined based on a programmed state corresponding to the k-th bit line among the programmed states and a programmed state corresponding to (k−1)-th bit line among the programmed state.

According to other embodiments of the inventive concept, there is provided a memory controller including an inverse syndrome former configured to receive a first data sequence and generate a coset representative sequence that can be divided into m-bit strings, where "m" is a natural number of at least 2; a viterbi detector configured to perform a first XOR operation on each of the m-bit strings in the coset representative sequence and binary bits and to determine a survivor path sequence according to a result of the first XOR operation; and a bit-to-state mapper configured to map a second data sequence to be stored in a first word line together with an output sequence, which is calculated by performing a second XOR operation on the coset representative sequence and the survivor path sequence, and the output sequence to programmed states.

The viterbi detector may calculate all possible branch metrics according to the result of the first XOR operation. The all possible branch metrics may be each calculated as the sum of parameters. The parameters may be defined according to a selection bit.

The viterbi detector may calculate the all possible branch metrics using a first programmed state sequence, which is determined based on the result of the first XOR operation and the second data sequence to be stored in the first word line together with the output sequence, and a second programmed state sequence determined based on page data bits that have been stored in a second word line.

According to further embodiments of the inventive concept, there is provided a memory system including the above-described memory controller and a non-volatile memory device configured to perform a program operation according to programmed states output from the memory controller.

The memory system may be a smart card, a secure digital (SD) card, a multi-media card (MMC), or a flash memory drive. The memory system may be a solid state drive (SSD).

BRIEF DESCRIPTION OF THE DRAWINGS

The above and other features and advantages of the inventive concept along with the making and use of the inventive concept will become more apparent to those skilled in the art upon consideration of certain exemplary embodiments with reference to the attached drawings in which.

DETAILED DESCRIPTION

Embodiments of the inventive concept now will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
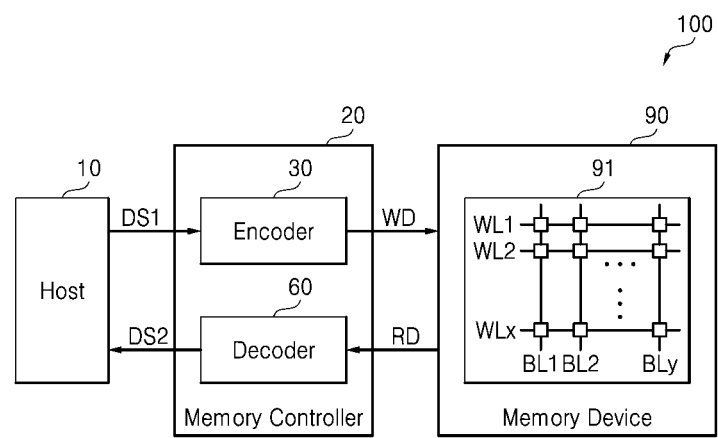
FIG. 1 is a block diagram illustrating a memory system including a memory controller according to certain embodiments of the inventive concept.

FIG. 1 is a block diagram illustrating a memory system 100 including a memory controller 20 according to certain embodiments of the inventive concept.

The memory system 100 may be implemented as an electronic device or a portable device, such as a cellular telephone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, or an e-book.

The memory system 100 of FIG. 1 generally comprises a host 10, a memory controller 20, and a non-volatile memory device 90.

The host 10 communicates an input data sequence DS1 to the memory controller 20 and receives an output data sequence DS2 from the memory controller 20.

The memory controller 20 controls the operation of the non-volatile memory device 90. For example, the memory controller 20 may be used to encode "input data" from the input data sequence DS1 received from the host 10, and control the non-volatile memory device 90 during a program operation used to program a write data sequence WD related to the encoded input data. The program operation may be performed by the memory controller 20 on a page by page basis, where a defined page size may be (e.g.) 512 bytes, 2048 bytes, or 4096 bytes, etc.

During a read operation requested by the host 10, the memory controller 20 may be used to receive a read data sequence RD from the non-volatile memory device 90, decode the read data sequence RD, and then communicate the resulting output data sequence DS2 to the host 10. In the foregoing context, the memory controller 20 of FIG. 1 is generally illustrated as including an encoder 30 and a decoder 60.

The encoder 30 may be used to encode the input data sequence DS1 to avoid an undesirable data pattern, and instead to provide an appropriate write data sequence WD less likely to engender serious coupling effects during the programming operation. That is, in many instances, were the input data sequence DS1 to be written to the non-volatile memory device 90 without encoding during a program operation, serious coupling effects might arise between proximate memory cells of the non-volatile memory device 90.

Use of the encoder 30 to avoid serious coupling effects necessitates the used commensurate use of the decoder 60 to decode a read data sequence RD and output a corresponding output data sequence DS2.

The non-volatile memory device 90 of FIG. 1 is assumed to be a flash memory device in the working examples that follow. However, the non-volatile memory device 90 might alternately be implemented using read-only memory (ROM), programmable ROM (PROM), erasable PROM (EPROM), electrically erasable PROM (EEPROM), ferro-electric random access memory (FRAM), magnetic RAM (MRAM), phase-change RAM (PRAM), nano-RAM (NRAM), silicon-oxide-nitride-oxide-silicon (SONOS), resistive memory, or racetrack memory.

In FIG. 1, the non-volatile memory device 90 includes a memory cell array 91 in which a plurality of memory cells are arranged to store data provided by the memory controller 20. Each of the memory cells is located at an intersection between one word line among a plurality of word lines (WL1 through WLx, where "x" is a natural number) and one bit line among a plurality of bit liens (BL1 through Bly, where "y" is a natural number).

Figure 2:
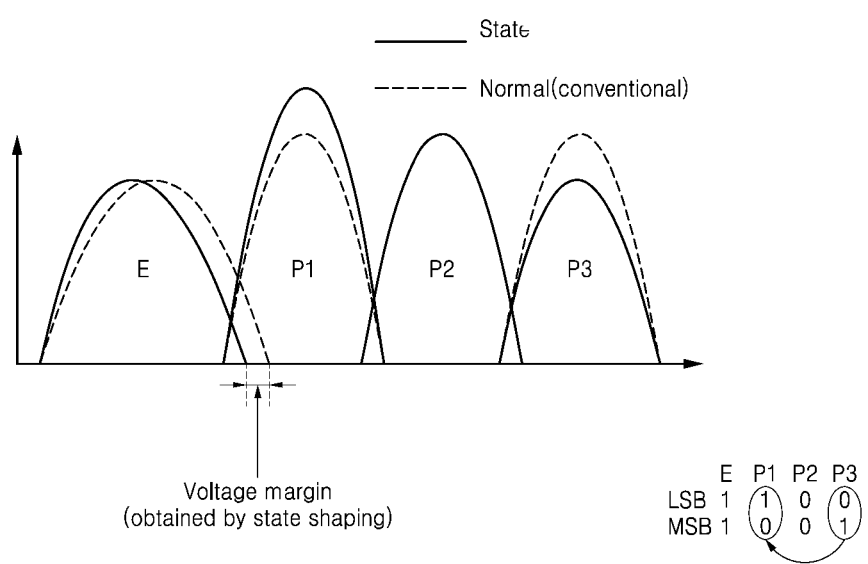
FIGS. 2 and 3 are respective diagrams illustrating threshold voltage distributions with respect to operation of the encoder of FIG. 1 according to certain embodiments of the inventive concept.

FIG. 2 is a diagram illustrating threshold voltage distributions with respect to the operation of the encoder 30 of FIG. 1 according to an embodiment of the inventive concept. FIG. 2 shows threshold voltage distributions associated with multi-level cells (MLCs) capable of storing 2-bit data (i.e., data values '00', '01', '01', and '11') Referring to FIGS. 1 and 2, the label 'E' denotes an erased state for the MLC and 'P1', 'P2' and 'P3' denote respective first, second and third programmed states for the MLC. Those skilled in the art will recognize that the assumption of a 2-bit capable MLC is just one type of MLC that may be used in various embodiments of the inventive concept.

The encoder 30 controls (i.e., defines) the "pattern" with which the input data of the input data sequence DS1 will be programmed in order to enhance the stored data reliability of the non-volatile memory device 90 and minimize the coupling effects caused by the corresponding program operation. For example, the encoder 30 may define a write data sequence WD that does not have an undesirable pattern (e.g., a case where one memory cell has the erased state E while an adjacent memory cell is programmed to the third programmed state P3).

In other words, the encoder 30 seeks to define write data sequence WD that reduces the number of memory cells arbitrarily programmed to one or more less favored programmed states (e.g., the third program state P3). In the context of FIG. 1, when the number of memory cells programmed to the third programmed state P3 is reduced, the number of memory cells programmed to the first programmed state P1 are increased and the threshold voltage distribution for the erased state E changes (i.e., widens). This intentionally biased, data patterning scheme that favors one or more data states over another data state during the definition of a write data sequence may be termed "state shaping". Consequently, more undesirable data patterns may be avoided by searching the input data sequence DS1 for data corresponding to a less favored data state in order to reduce the number of memory cells that would otherwise be arbitrarily programmed to the less favored state (e.g., the third programmed state P3).

Figure 3:
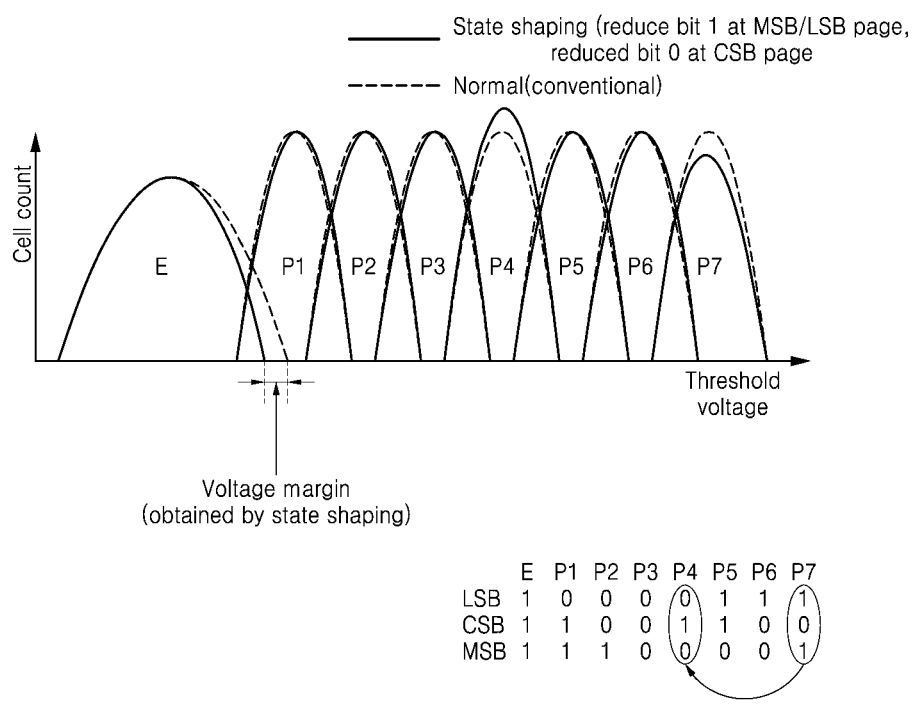

FIG. 3 is a diagram illustrating threshold voltage distributions with respect to the operation of the encoder 30 of in FIG. 1 according to another embodiment of the inventive concept. FIG. 3 shows the threshold voltage distributions associated with triple-level memory cells (TLCs) capable of storing 3-bit data. Referring to FIGS. 1 and 3, E again denotes an erased state, while and P1, P2, P3, P4, P5, P6 and P7 denote respective programmed states.

In the context of the FIG. 3, the encoder 30 may again be used to search the input data of an input data sequence DS1 in order to reduce a number of memory cells that will be programmed to a less favored state (e.g., seventh programmed state P7). Assuming that the number of memory cells programmed to the seventh programmed state P7 is reduced, the number of memory cells programmed to the fourth programmed state P4 is increases and the threshold voltage distribution associated with memory cells programmed to the erased state E changes (i.e., widens). Consequently, undesirable patterns (e.g., a case where one memory cell has the erased state E while an adjacent memory cell is programmed to the seventh programmed state P7) is avoided.

Figure 4:
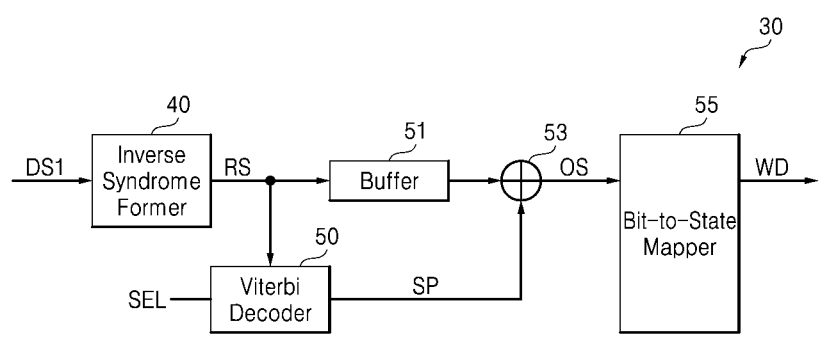
FIG. 4 is a block diagram further illustrating in one possible example the encoder of FIG. 1.
Figure 5:
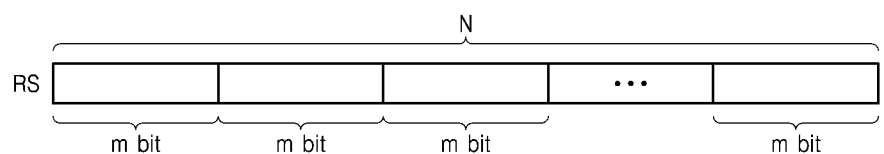
FIG. 5 is a diagram illustrating in one possible example a coset representative sequence that may be provided by the inverse syndrome former of FIG. 4.

FIG. 4 is a block diagram further illustrating in one possible example the encoder 30 of FIG. 1, and FIG. 5 is a diagram illustrating a coset representative sequence RS that may be provided by the inverse syndrome former 40 of FIG. 4. Referring collectively to FIGS. 1, 2, 3, and 4, the encoder 30 includes the inverse syndrome former 40, a viterbi detector 50, a buffer 51, an XOR operator 53, and a bit-to-state mapper 55.

The inverse syndrome former 40 receives the input data sequence DS1 and may be used to generate a corresponding "coset representative sequence" RS that is divisible into m-bit strings, where "m" is a natural number greater than 1. Referring to FIG. 5, the length of the coset representative sequence RS is N, where N is a natural number and may be divided into a plurality of m-bit strings. The operation of the inverse syndrome former 40 will be described in some additional detail with reference to FIGS. 6, 7, 8, and 9 hereafter.

Referring to FIGS. 1, 2, 3, and 4, the viterbi detector 50 may be used to perform a first XOR operation on each of the m-bit strings in the coset representative sequence RS. That is, convolutionally-encoded binary bits and the m-bit strings may be used during the first XOR operation to determine a survivor path sequence SP. The viterbi detector 50 may be used to perform the first XOR operation on each m-bit string. The operation of the viterbi detector 50 will be described in some additional detail with reference to FIG. 10 hereafter.

The buffer 51 may be used to temporarily store the coset representative sequence RS. The XOR operator 53 may be used to perform a second XOR operation on the coset representative sequence RS and the survivor path sequence SP in order to calculate an output sequence OS. Then, the bit-to-state mapper 55 may be used to map the output sequence OS. A resulting second data sequence to be stored in memory cells connected to a particular word line (e.g., the first word line WL1) together with the output sequence OS that is used to define the programmed states for data in the write data sequence WD indicating the mapped programmed states are provided to the non-volatile memory device 90.

Figure 6:
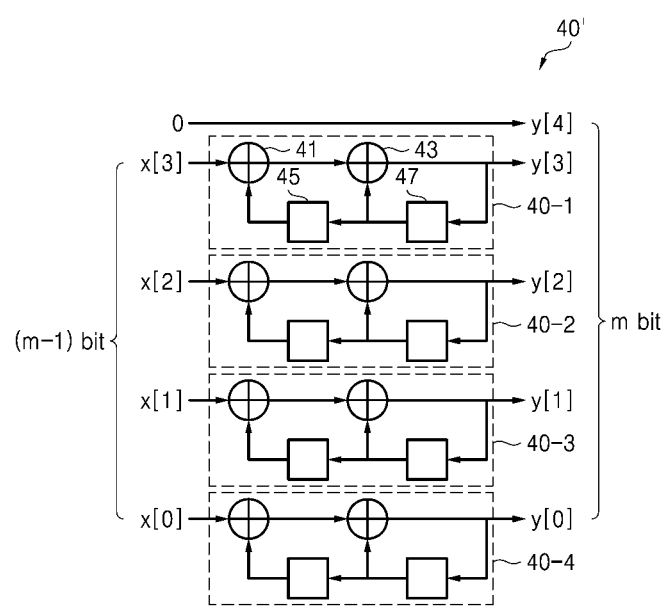
FIG. 6 is a block diagram further illustrating in one possible example the inverse syndrome former of FIG. 4.

FIG. 6 is a block diagram of an example 40' of the inverse syndrome former 40 of FIG. 4. Referring to FIGS. 1, 4, and 6, the inverse syndrome former 40' is constructed based on a convolutional code that have a constraint length of 3 and generator polynomials of [1 0 1] and [1 1 1].

The inverse syndrome former 40' includes a plurality of inverse syndrome former units 40-1, 40-2, 40-3, and 40-4. When output bits y[0] through y[4] of the inverse syndrome former 40' are "m" bits, input bits x[0] through x[3] of the inverse syndrome former 40' are (m−1) bits. Each of the input bits x[0] through x[3] may be a most significant bit (MSB) to be stored in the first word line WL1.

The input bits x[0] through x[3] of the inverse syndrome former 40' are part of the data sequence DS1. The first inverse syndrome former unit 40-1 includes a plurality of XOR operators 41 and 43 and a plurality of shift registers 45 and 47. The structure of the other inverse syndrome former units 40-2, 40-3, and 40-4 is the same as that of the first inverse syndrome former unit 40-1. The number of inverse syndrome former units may vary with embodiments of the inventive concept.

When the data sequence DS1 is "0110 1101 1010", the inverse syndrome former 40' sequentially receives (m−1)-bit strings, i.e., "0110", "1101", and "1010" and sequentially outputs m-bit strings "00110", "01011", and "00111".

Figure 7:
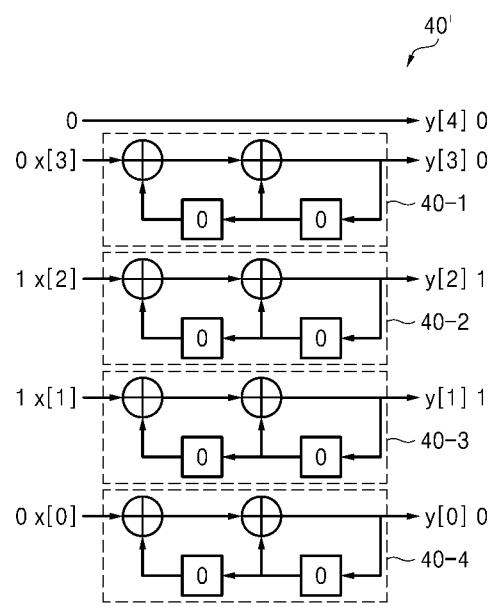
FIGS. 7, 8 and 9 are block diagrams that illustrate possible mode(s) of operation for the inverse syndrome former of FIG. 6.
Figure 8:
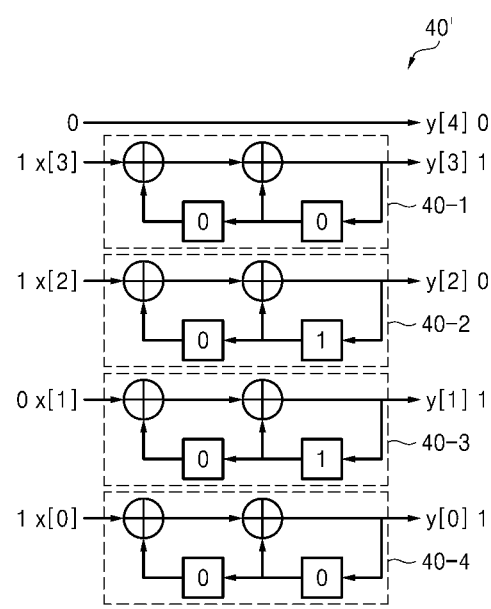
Figure 9:
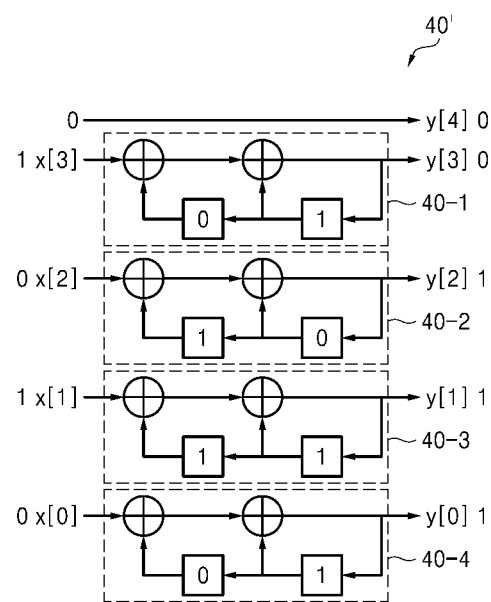

FIGS. 7, 8 and 9 are respective block diagrams further illustrating operation of the inverse syndrome former 40' of FIG. 6. Referring to FIGS. 6 and 7, the inverse syndrome former 40' receives the (m−1)-bit string "0110" and outputs the m-bit string "00110". Referring to FIGS. 6 and 8, after outputting the m-bit string "00110", the inverse syndrome former 40' receives the (m−1)-bit string "1101" and outputs the m-bit string "01011".

Referring to FIGS. 6 and 9, after outputting the m-bit string "01011", the inverse syndrome former 40' receives the (m−1)-bit string "1010" and outputs the m-bit string "00111". Consequently, when the inverse syndrome former 40' receives the data sequence DS1 "0110 1101 1010", the inverse syndrome former 40' outputs the coset representative sequence RS "00110 01011 00111".

Figure 10:
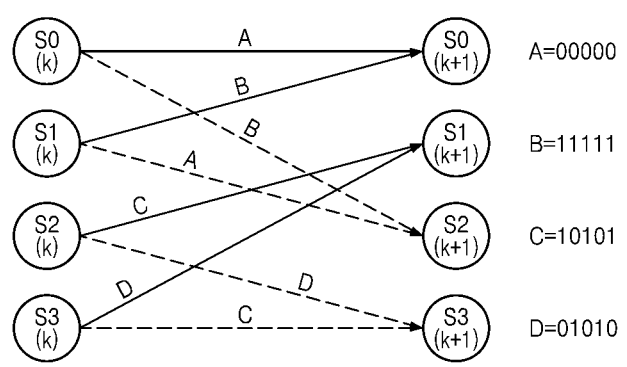
FIG. 10 is a trellis diagram that further illustrates the operation of the viterbi detector of FIG. 4 during the calculation of branch metrics.

FIG. 10 is a trellis diagram illustrating operation of the viterbi detector 50 of FIG. 4 during the calculation of branch metrics. In FIG. 10, S0(k), S1(k), S2(k), and S3(k) denote present states; and S0(k+1), S1(k+1), S2(k+1), and S3(k+1) denote next states.

Referring to FIGS. 1, 4, and 10, the viterbi detector 50 performs the first XOR operation on each of m-bit strings in the coset representative sequence RS and binary bits A, B, C, and D and calculates all possible branch metrics according to the result of the first XOR operation.

For instance, when an m-bit string in the coset representative sequence RS is "00110" and the binary bits A, B, C, and D are "00000", "11111", "10101", and "01010", respectively, the result of the first XOR operation is "00110", "11001", "10011", and "01100". When an m-bit string in the coset representative sequence RS is "01011", the result of the first XOR operation is "01011", "10100", "11110", and "00001". When an m-bit string in the coset representative sequence RS is "00111", the result of the first XOR operation is "00111", "11000", "10010", and "01101".

Each of all possible branch metrics is calculated as the sum of parameters λ1, λ2, λ3, λ4, and λ5. The parameters λ1, λ2, λ3, λ4, and λ5 are defined according to a selection bit SEL. For instance, when the selection bit SEL is "1" and the result of the first XOR operation is bit "0", one of the parameters λ1, λ2, λ3, λ4, and λ5 corresponding to the bit "0" is "0". When the result of the first XOR operation is "00110", the parameters λ1, λ2, λ3, λ4, and λ5 are "0", "0", "1", "1", and "0", respectively. A branch metric is calculated as the sum of the parameters λ1, λ2, λ3, λ4, and λ5, and therefore, the branch metric is 0+0+1+1+0=2. Table 1 summarizes these result.

TABLE 1

| m-bit string in coset representative sequence RS | Binary bits A, B, C, and D | Result of first XOR operation | All possible branch metrics |
| --- | --- | --- | --- |
| 00110 | A = 00000 | 00110 | 0 + 0 + 1 + 1 + 0 = 2 |
|  | B = 11111 | 11001 | 1 + 1 + 0 + 0 + 1 = 3 |
|  | C = 10101 | 10011 | 1 + 0 + 0 + 1 + 1 = 3 |
|  | D = 01010 | 01100 | 0 + 1 + 1 + 0 + 0 = 2 |
| 01011 | A = 00000 | 01011 | 0 + 1 + 0 + 1 + 1 = 3 |
|  | B = 11111 | 10100 | 1 + 0 + 1 + 0 + 0 = 2 |
|  | C = 10101 | 11110 | 1 + 1 + 1 + 1 + 0 = 4 |
|  | D = 01010 | 00001 | 0 + 0 + 0 + 0 + 1 = 1 |
| 00111 | A = 00000 | 00111 | 0 + 0 + 1 + 1 + 1 = 3 |
|  | B = 11111 | 11000 | 1 + 1 + 0 + 0 + 0 = 2 |
|  | C = 10101 | 10010 | 1 + 0 + 0 + 1 + 0 = 2 |
|  | D = 01010 | 01101 | 0 + 1 + 1 + 0 + 1 = 3 |

When the selection bit SEL is "1" and the result of the first XOR operation is bit "1", one of the parameters λ1, λ2, λ3, λ4, and λ5 corresponding to the bit "1" is "1".

Figure 11:
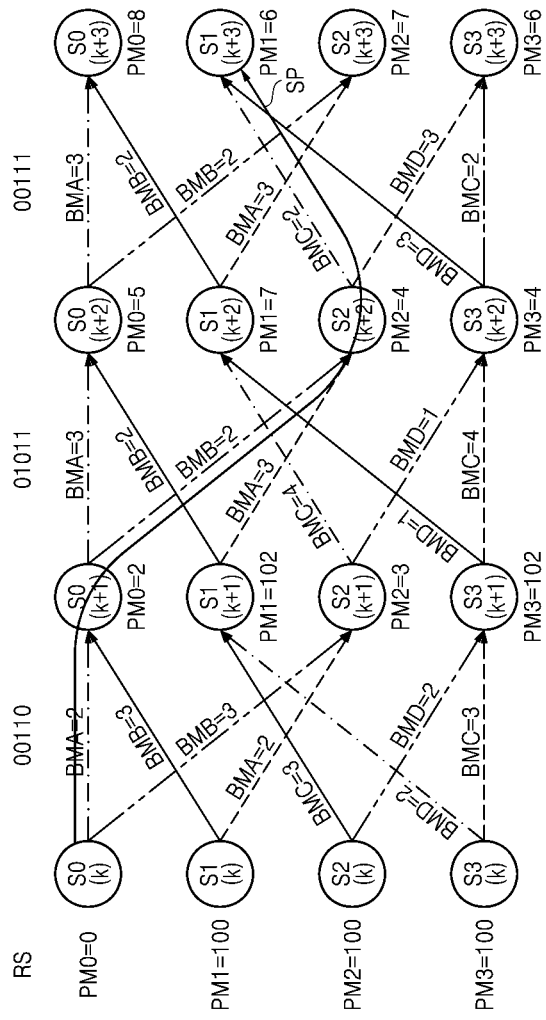
FIG. 11 is a trellis diagram that further illustrates the operation of the viterbi detector of FIG. 4 during the determination of a survivor path sequence.

FIG. 11 is a trellis diagram illustrating operation of the viterbi detector 50 of FIG. 4 during the determination of the survivor path sequence SP. In FIG. 11, BMA, BMB, BMC, and BMD denote branch metrics and PM0, PM1, PM2, and PM3 denote path metrics.

Referring to FIGS. 1, 4, and 11, the viterbi detector 50 determines the survivor path sequence SP based on all possible branch metrics. The survivor path sequence SP is "00000 11111 10101". Path metrics are calculated from all possible branch metrics and the survivor path sequence SP is determined based on the path metrics.

The XOR operator 53 performs the second XOR operation on the coset representative sequence RS "00110 01011 00111" and the survivor path sequence SP "00000 11111 10101" and calculates the output sequence OS "00110 10100 10010".

The bit-to-state mapper 55 maps the output sequence OS "00110 10100 10010" and the data sequence DS2 "11000 01001 11100" to be stored in the first word line WL1 together with the output sequence OS "00110 10100 10010" to program states. Referring to FIG. 2, the erased state E is "11", the programmed state P1 is "10", the programmed state P2 is "00", and the programmed state P3 is "01. Therefore, the mapped programmed states are P3, P3, P1, P1, P2, P1, P3, P1, P2, P3, E, P3, P3, P1, and P2.

The bit-to-state mapper 55 controls the actual data programmed by the non-volatile memory device 90 during a program operation according to the mapped program states. In this manner, the encoder 30 may be used to search for a data sequence that reduces the number of cells in the third programmed state P3.

For instance, the encoder 30 may search for a data sequence that avoids an undesirable pattern (e.g., a case where one memory cell has the erased state E and an adjacent memory cell is to be programmed to the third programmed state P3). The viterbi detector 50 receives a first data sequence to be stored in the first word line WL1 together with the output sequence OS. When the output sequence OS corresponds to an MSB data sequence in the first word line WL1, the first data sequence corresponds to a least significant bit (LSB) data sequence. The results of the first XOR operation and the first data sequence form a "first programmed state sequence".

For instance, when the first bit in the result of the first XOR operation is "0" and the first bit in the first data sequence is "1", the first state in the first programmed state sequence is P3 since the LSB is "0" and the MSB is "1" in the state P3 in FIG. 2.

The viterbi detector 50 also receives a second programmed state sequence determined by page data bits stored in the second word line WL2. For instance, when the first MSB and the first LSB are "0" and "1", respectively, in the second word line WL2, the first state in the second programmed state sequence is P1 since the LSB and the MSB are "1" and "0", respectively, in the state P1 in FIG. 2.

The viterbi detector 50 calculates all possible branch metrics based on the first programmed state sequence and the second programmed state sequence. Each of all possible branch metrics is calculated as the sum of parameters.

The first programmed state sequence corresponds to a sequence of bit lines. For instance, a k-th state in the first programmed state sequence corresponds to the k-th bit line among the plurality of bit lines.

When a program state corresponding to the k-th bit line in the first programmed state sequence is the erased state E and a program state corresponding to the k-th bit line in the second programmed state sequence is the third programmed state P3, the parameter λk corresponding to the k-th bit line is "1" and the other parameters are "0". Table 2 summarizes these results.

TABLE 2

| | | | |
|---|---|---|---|
| State corresponding to k-th bit line in first programmed state sequence | E | P3 | Other cases |
| State corresponding to k-th bit line in second programmed state sequence | P3 | E | Other cases |
| Parameter λk corresponding to k-th bit line | 1 | 1 | 0 |

For instance, when the result of the first XOR operation is "00110" and the first data sequence is "11100", the first programmed state sequence is "P1, P1, E, P3, and P2". When the second programmed state sequence is "P2, P2, E, E, and P1", the parameters λ1, λ2, λ3, λ4, and λ5 are "0", "0", "0", "1", and "0". Since a branch metric is calculated as the sum of the parameters λ1, λ2, λ3, λ4, and λ5, the branch metric is 0+0+0+1+0=1. Table 3 summarizes these results.

TABLE 3

| | | | | | |
|---|---|---|---|---|---|
| State in first programmed state sequence | P1 | P1 | E | P3 | P2 |
| State in second programmed state sequence | P2 | P2 | E | E | P1 |
| Parameters λ1, λ2, λ3, λ4, and λ5 | λ1 = 0 | λ2 = 0 | λ3 = 0 | λ4 = 1 | λ5 = 0 |
| Branch metric | | | 0 + 0 + 0 + 1 + 0 = 1 | | |

A parameter may have a different value according to the first programmed state sequence and the second programmed state sequence, as shown in Table 4.

TABLE 4

| | | | | | | | | |
|---|---|---|---|---|---|---|---|---|
| State corresponding to k-th bit line in first programmed state sequence | E | E | E | E | P1 | P2 | P3 | Other cases |
| State corresponding to k-th bit line in second programmed state sequence | E | P1 | P2 | P3 | E | E | E | |
| Parameter λk corresponding to k-th bit line | 1 | 4 | 9 | 16 | 4 | 9 | 16 | 0 |

In other embodiments, when the viterbi detector 50 receives the first data sequence to be stored in the first word line WL1 together with the output sequence OS, it may calculate all possible branch metrics based on the result of the first XOR operation and programmed states determined according to the first data sequence.

Each of all possible branch metrics is calculates as the sum of the parameters λ1, λ2, λ3, λ4, and λ5. The parameter λk corresponding to the k-th bit line may have a different value according to a programmed state corresponding to the k-th bit line and a programmed state corresponding to the (k−1)-th bit line among the programmed states, as shown in Table 5.

TABLE 5

| | | | | | | | | |
|---|---|---|---|---|---|---|---|---|
| Programmed state corresponding to k-th bit line | E | E | E | E | P1 | P2 | P3 | Other cases |
| Programmed state corresponding to (k − 1)-th bit line | E | P1 | P2 | P3 | E | E | E | |
| Parameter λk corresponding to k-th bit line | 1 | 4 | 9 | 16 | 4 | 9 | 16 | 0 |

Figure 12:
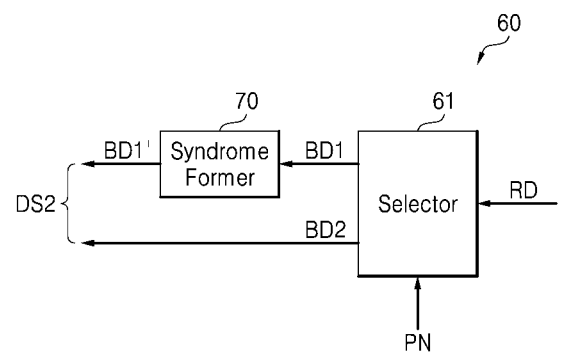
FIG. 12 is a block diagram further illustrating in one possible example the decoder of FIG. 1.

FIG. 12 is a block diagram further illustrating in one example the decoder 60 of FIG. 1. Referring to FIGS. 1 and 12, the decoder 60 comprises a selector 61 and a syndrome former 70. The decoder 60 receives a read data sequence RD from the non-volatile memory device 90. The read data sequence RD may include an MSB data sequence BD1 stored in a word line, e.g., WL1, and an LSB data sequence BD2 of the word line WL1.

The selector 61 outputs the MSB data sequence BD1 to the syndrome former 70 in response to a selection signal PN and outputs the LSB data sequence BD2 to the host 10. The data sequence DS2 includes a data sequence BD1' output from the syndrome former 70 and the LSB data sequence BD2.

Figure 13:
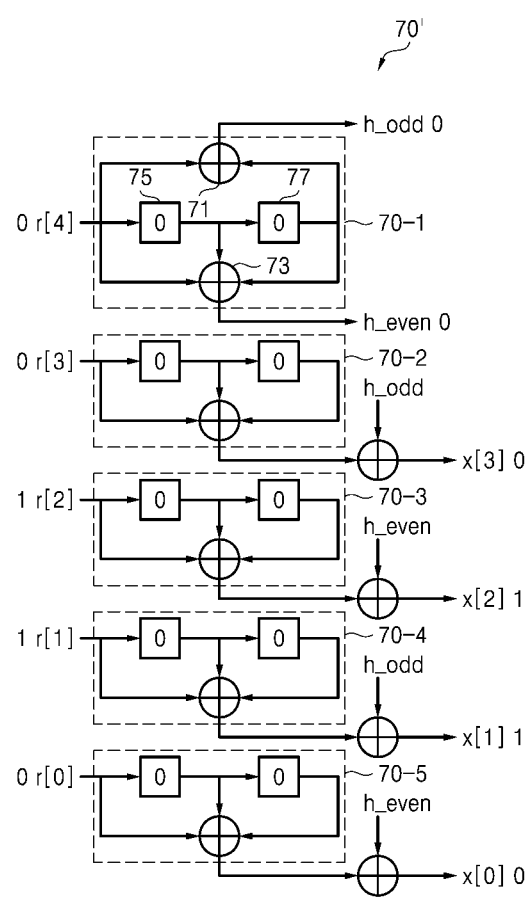
FIGS. 13, 14 and 15 are respective block diagrams further illustrating the operation of the syndrome former of FIG. 12.
Figure 14:
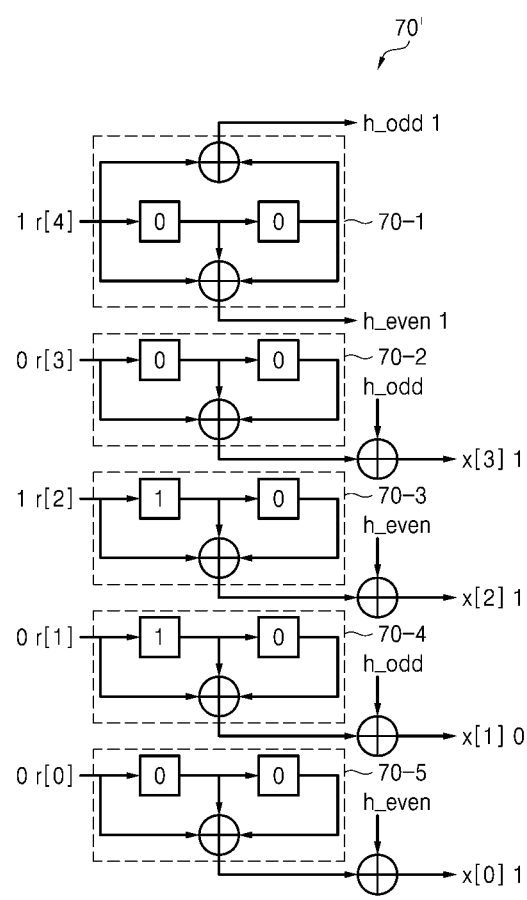
Figure 15:
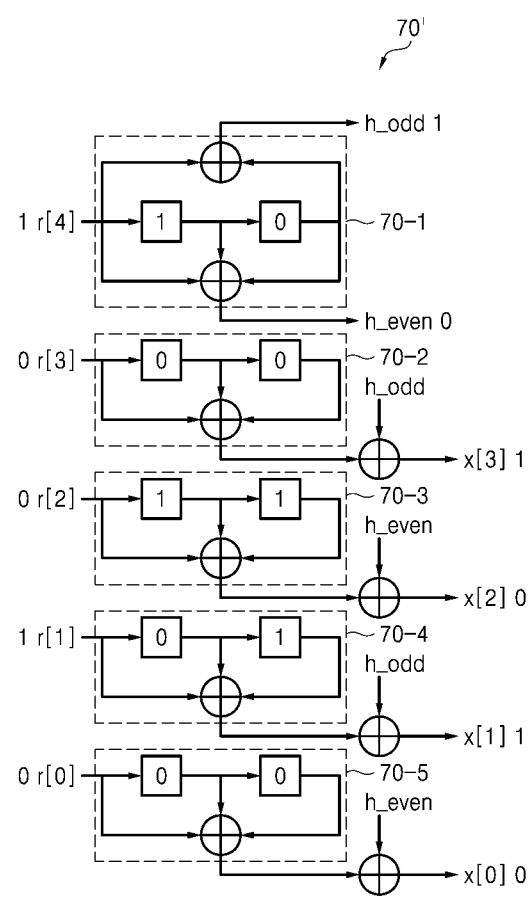

FIGS. 13, 14 and 15 are block diagrams further illustrating operation of the syndrome former 70 of FIG. 12. Referring to FIGS. 1, 12, and 13, a syndrome former 70' corresponding to the syndrome former 70 includes a plurality of syndrome former units 70-1, 70-2, 70-3, 70-4, and 70-5. When input bits r[0] through r[4] of the syndrome former 70' are "m" bits, output bits x[0] through x[3] of the syndrome former 70' are (m−1) bits.

Each of the input bits r[0] through r[4] may be an MSB that has been stored in the first word line WL1. The input bits r[0] through r[4] of the syndrome former 70' are part of the read data sequence RD. The first syndrome former unit 70-1 includes a plurality of XOR operators 71 and 73 and a plurality of shift registers 75 and 77. The structure of the other syndrome former units 70-2, 70-3, 70-4, and 70-5 is the same as that of the first syndrome former unit 70-1. The number of syndrome former units may vary with the embodiments of the inventive concept.

When the MSB data sequence BD1 is "00110 10100 10010", the syndrome former 70' sequentially receives m-bit strings "00110", "10100", and "10010" and sequentially outputs (m−1)-bit strings "0110", "1101", and "1010".

Figure 16:
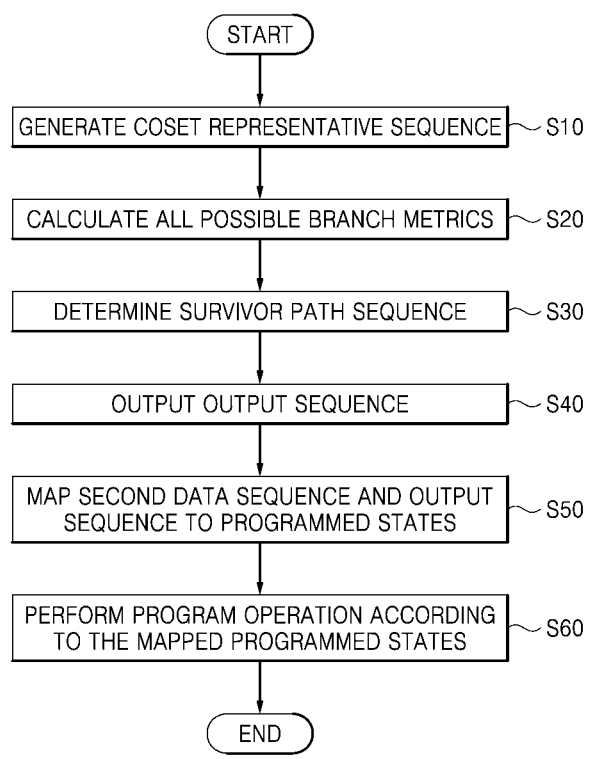
FIG. 16 is a flowchart summarizing one possible method of operating the memory controller of FIG. 1.

FIG. 16 is a flowchart summarizing in one possible example a method of operating the memory controller 20 of FIG. 1. Referring to FIGS. 1, 4, and 16, the inverse syndrome former 40 receives the input data sequence DS1 and generates a corresponding coset representative sequence RS capable of being divided into m-bit strings (S10).

The viterbi detector 50 performs the first XOR operation on each of the m-bit strings in the coset representative sequence RS and then calculates all possible branch metrics according to the result of the first XOR operation (S20). The viterbi detector 50 then determines the survivor path sequence SP based on the all possible branch metrics (S30).

The XOR operator 53 performs the second XOR operation on the coset representative sequence RS and the survivor path sequence SP and outputs the output sequence OS (S40). The bit-to-state mapper 55 then maps the output sequence OS and a second data sequence to be stored in the first word line WL1 together with the output sequence OS to programmed states (S50). Finally, the non-volatile memory device 90 performs a program operation according to the mapped programmed states (S60).

Figure 17:
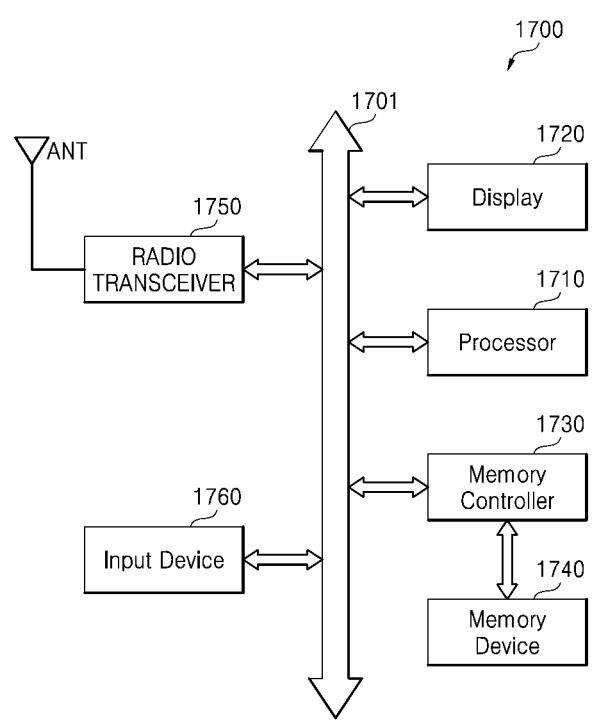
FIG. 17 is a block diagram of a memory system according to certain embodiments of the inventive concept.

FIG. 17 is a block diagram of a memory system 1700 according to certain embodiments of the inventive concept. Referring to FIG. 17, the memory system 1700 includes a memory controller 1730, a non-volatile memory device 1740, and a processor 1710. The memory controller 1730 may be implemented within the processor 1710.

The memory controller 1730 and the non-volatile memory device 1740 respectively correspond to the memory controller 20 and the non-volatile memory device 90 illustrated in FIG. 1. The memory controller 1730 may control the access operations, e.g., a program operation, an erase operation, and a read operation, of the non-volatile memory device 1740 according to the control of the processor 1710.

Data programmed in the non-volatile memory device 1740 may be displayed through a display 1720 according to the control of the processor 1710 and/or the memory controller 1730. An input device 1760 enables control signals for controlling the operation of the processor 1710 or data to be processed by the processor 1710 to be input to the memory system 1700. The input device 1760 may be implemented by a pointing device such as a touch pad or a computer mouse, a keypad, or a keyboard.

A radio transceiver 1750 transmits or receives radio signals through an antenna ANT. The radio transceiver 1750 may convert radio signals received through the antenna ANT into signals that can be processed by the processor 1710. The processor 1710 may process the signals output from the radio transceiver 1750 and transmit the processed signals to the memory controller 1730 or the display 1720.

The memory controller 1730 may program the signals processed by the processor 1710 to the non-volatile memory device 1740. The radio transceiver 1750 may also convert signals output from the processor 1710 into radio signals and output the radio signals to an external device through the antenna ANT.

The processor 1710 may control the operation of the display 1720 to display data output from the memory controller 1730, data output from the radio transceiver 1750, or data output from the input device 1760. The elements 1710, 1720, 1730, 1740, 1750, and 1760 of the memory system 1700 may communicate with one another through a bus 1701.

Figure 18:
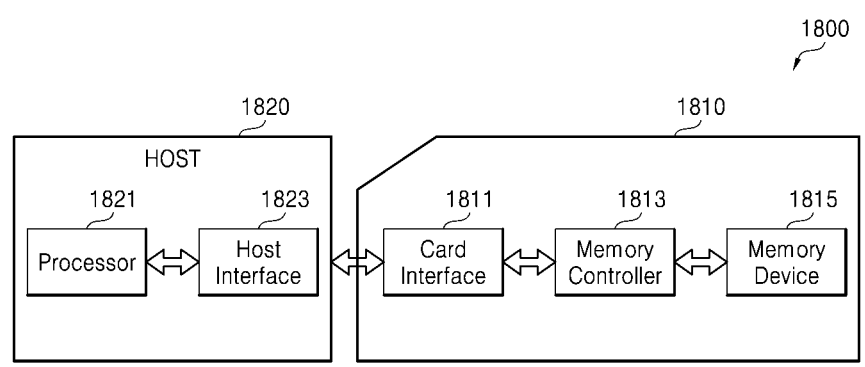
FIG. 18 is a block diagram of a memory card system according to certain embodiments of the inventive concept.

FIG. 18 is a block diagram of a memory card system 1800 according to embodiments of the inventive concept. Referring to FIG. 18, the memory system 1800 may be implemented as a memory card or a smart card. The memory system 1800 includes a host 1820 and a card system 1810.

The card system 1810 includes a memory controller 1813, a non-volatile memory device 1815, and a card interface 1811. The host 1820, the memory controller 1813, and the non-volatile memory device 1815 respectively correspond to the host 10, the memory controller 20, and the non-volatile memory device 90 illustrated in FIG. 1. The memory controller 1813 may control data exchange between the non-volatile memory device 1815 and the card interface 1811.

The card interface 1811 may be a secure digital (SD) card interface or a multi-media card (MMC) interface, but the inventive concept is not restricted to the current embodiments. The card interface 1811 may interface the host 1820 and the memory controller 1813 for data exchange according to a protocol of the host 1820. The card interface 1811 may support a universal serial bus (USB) protocol and an inter-chip (IC)-USB protocol. Here, the card interface 1811 may indicate a hardware supporting a protocol used by the host 1820, software installed in the hardware, or a signal transmission mode.

When the card system 1810 is connected with a host interface 1823 of the host 1820, the host interface 1823 may perform data communication with the non-volatile memory device 1815 through the card interface 1811 and the memory controller 1813 according to the control of a processor 1821. At this time, the host 1820 may be a PC, a tablet PC, a digital camera, a digital audio player, a cellular phone, a console video game hardware, or a digital set-top box. The card system 1810 may be implemented as a flash memory drive, a USB memory drive, an IC-USB memory drive, or a memory stick.

Figure 19:
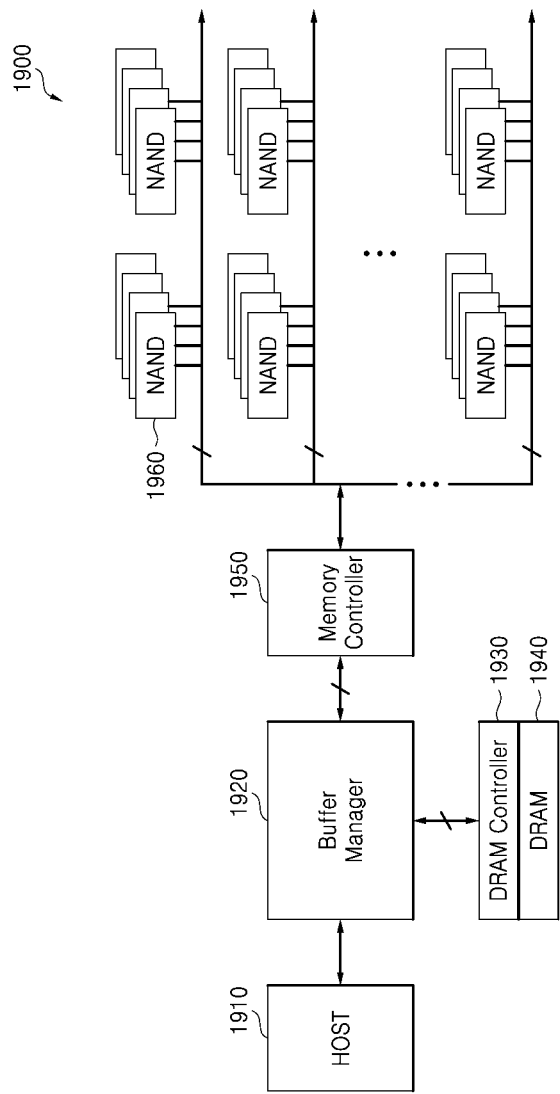
FIG. 19 is a block diagram of a memory system according to still other embodiments of the inventive concept.

FIG. 19 is a block diagram of a memory system 1900 according to certain embodiments of the inventive concept. Referring to FIG. 19, the memory system 1900 may be implemented as a data storage device such as a solid state drive (SSD).

The memory system 1900 includes a host 1910, a memory controller 1950, a plurality of memory devices 1960, e.g., NAND flash memory devices, a buffer manager 1920, a dynamic random access memory (DRAM) controller 1930, and a DRAM 1940. The host 1910, the memory controller 1950, and one of the memory devices 1960 respectively correspond to the host 10, the memory controller 20, and the non-volatile memory device 90 illustrated in FIG. 1. The memory controller 1950 may control the access operation of the memory devices 1960.

The buffer manager 1920 may control data transmission among the host 1910, the memory controller 1950, and the DRAM controller 1930. The DRAM controller 1930 may control data transmission between the buffer manager 1920 and the DRAM 1940.

As described above, according to certain embodiments of the inventive concept, a memory controller may be used to search for a data sequence having a desirable data pattern. This desirable (or more desirable) data pattern may then be used to define a write data sequence for a non-volatile memory device, thereby enhancing the reliability of the non-volatile memory device.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A method of operating a memory controller, the method comprising:
   receiving an input data sequence from a host;
   generating a coset representative sequence divisible into m-bit strings, where "m" is a natural number greater than 1, from the input data sequence;
   performing a first XOR operation on each of the m-bit strings in the coset representative sequence;
   calculating all possible branch metrics according to a result of the first XOR operation;
   determining a survivor path sequence based on the all possible branch metrics;
   performing a second XOR operation on the coset representative sequence and the survivor path sequence to generate an output sequence; and
   providing write data sequence based on the output sequence to a non-volatile memory device,
   wherein the calculating the all possible branch metrics comprises:
   calculating the all possible branch metrics using a first programmed state sequence determined on the basis of the first XOR operation and a second data sequence to be stored in a first word line together with the output sequence, and a second programmed state sequence determined on the basis of page data bits that have been stored in a second word line.

2. The method of claim 1, further comprising:
   mapping a second data sequence to be stored in a first word line of the non-volatile memory device together with the output sequence, wherein the output sequence defines mapped programmed states for data in the write data sequence; and
   controlling the non-volatile memory device to perform a program operation according to the mapped programmed states.

3. The method of claim 1, wherein the all possible branch metrics are each calculated as the sum of parameters, wherein the parameters are defined according to a selection bit.

4. The method of claim 3, wherein when the selection bit is "1" and the result of the first XOR operation is bit "0", one of the parameters corresponding to the bit "0" is "0", and when the selection bit is "1" and the result of the first XOR operation is bit "1", one of the parameters corresponding to the bit "1" is "1".

5. The method of claim 1, wherein the non-volatile memory device comprises multi-level memory cells capable of being programmed to one of an erased state and a number of programmed states including a highest programmed state, the all possible branch metrics are each calculated as a sum of parameters, and
   when a programmed state corresponding to a k-th bit line in the first programmed state sequence is the erased state and a programmed state corresponding to the k-th bit line in the second programmed state sequence is the highest programmed state, a parameter corresponding to the k-th bit line among the parameters is "1" and the other parameters are "0".

6. The method of claim 1, wherein the all possible branch metrics are each calculated as a sum of parameters, and the parameters have different values according to the first programmed state sequence and the second programmed state sequence.

7. A method of operating a memory controller, the method comprising:
   receiving an input data sequence from a host;
   generating a coset representative sequence divisible into m-bit strings, where "m" is a natural number greater than 1, from the input data sequence;
   performing a first XOR operation on each of the m-bit strings in the coset representative sequence;
   calculating all possible branch metrics according to a result of the first XOR operation;
   determining a survivor path sequence based on the all possible branch metrics;
   performing a second XOR operation on the coset representative sequence and the survivor path sequence to generate an output sequence; and
   providing write data sequence based on the output sequence to a non-volatile memory device,
   wherein the calculating the all possible branch metrics comprises calculating the all possible branch metrics using programmed states determined as a result of the first XOR operation and a second data sequence to be stored in a first word line together with the output sequence.

8. The method of claim 7, wherein the all possible branch metrics are each calculated as a sum of parameters, and a value of a parameter corresponding to a k-th bit line among the parameters is determined based on a programmed state corresponding to the k-th bit line among the programmed states and a programmed state corresponding to (k−1)-th bit line among the programmed state.

9. A memory controller configured for use in a memory system with a non-volatile memory device, the memory controller comprising:
   an inverse syndrome former that receives an input data sequence and generates a coset representative sequence divisible into m-bit strings, where "m" is a natural number greater than 1;
   a viterbi detector that performs a first XOR operation on each of the m-bit strings in the coset representative sequence to determine a survivor path sequence according to a result of the first XOR operation; and
   a bit-to-state mapper that maps a second data sequence to be stored in a first word line of the non-volatile memory device together with an output sequence calculated by performing a second XOR operation on the coset representative sequence and the survivor path sequence, and provides an output sequence defining programmed states for data in a write data sequence provided to the non-volatile memory device,
   wherein the viterbi detector calculates the all possible branch metrics using a first programmed state sequence determined based on the first XOR operation and the second data sequence to be stored in the first word line together with the output sequence, and a second programmed state sequence determined on the basis of page data bits that have been stored in a second word line.

10. A memory system comprising:
    the memory controller of claim 9; and
    a non-volatile memory device that performs a program operation according to the programmed states of the write data sequence received from the memory controller.

11. The memory system of claim 10, wherein the memory system is one selected from the group consisting of a smart card, a secure digital (SD) card, a multi-media card (MMC), and a flash memory drive.

12. The memory system of claim 10, wherein the memory system is a solid state drive (SSD).

* * * * *